United States Patent
Genoni et al.

(10) Patent No.: US 11,094,428 B2
(45) Date of Patent: Aug. 17, 2021

(54) SHIELDED CABLES

(71) Applicant: SOLVAY SPECIALTY POLYMERS ITALY S.P.A., Bollate (IT)

(72) Inventors: Massimo Genoni, Imola (IT); Stefano Mauri, Giussano (IT); Mattia Bassi, Milan (IT); Marco Apostolo, Senago (IT); Marco Avataneo, Milan (IT)

(73) Assignee: SOLVAY SPECIALTY POLYMERS ITALY S.P.A., Bollate (IT)

( * ) Notice: Subject to any disclaimer, the term of this patent is extended or adjusted under 35 U.S.C. 154(b) by 0 days.

(21) Appl. No.: 16/617,410

(22) PCT Filed: May 24, 2018

(86) PCT No.: PCT/EP2018/063728
§ 371 (c)(1),
(2) Date: Nov. 26, 2019

(87) PCT Pub. No.: WO2018/219790
PCT Pub. Date: Dec. 6, 2018

(65) Prior Publication Data
US 2020/0143956 A1 May 7, 2020

Related U.S. Application Data

(60) Provisional application No. 62/512,376, filed on May 30, 2017.

(30) Foreign Application Priority Data

Jan. 24, 2018 (EP) .................................. 18153301

(51) Int. Cl.
  H01B 7/26 (2006.01)
  H01B 3/44 (2006.01)
  (Continued)

(52) U.S. Cl.
  CPC ......... H01B 3/445 (2013.01); C23C 18/1641 (2013.01); C23C 18/1653 (2013.01);
  (Continued)

(58) Field of Classification Search
  CPC ...................................................... H01B 7/26
  (Continued)

(56) References Cited

U.S. PATENT DOCUMENTS 2,515,628 A  7/1950 Castle
2,520,338 A  8/1950 Robertson
(Continued)

FOREIGN PATENT DOCUMENTS

EP  0199138 A2  10/1986
JP  2006294551 A2  10/2006
(Continued)

OTHER PUBLICATIONS

Standard ASTM D3418-08, "Standard Test Method for Transition Temperatures and Enthalpies of Fusion and Crystallization of Polymers by Differential Scanning Calorimetry", 2008, p. 1-7.

*Primary Examiner* — Chau N Nguyen
(74) *Attorney, Agent, or Firm* — Osha Bergman Watanabe & Burton LLP

(57) ABSTRACT

The present invention relates to a cable, suitable for both electrical and data transmission, comprising at least one shield layer, comprising a metal layer directly adhering onto the polymeric layer.

14 Claims, 2 Drawing Sheets

(51) Int. Cl.
*C23C 18/16* (2006.01)
*C23C 18/32* (2006.01)
*C23C 18/40* (2006.01)
*C25D 9/04* (2006.01)
*H01B 7/02* (2006.01)
*H01B 13/22* (2006.01)
*H05K 9/00* (2006.01)

(52) U.S. Cl.
CPC ............ *C23C 18/32* (2013.01); *C23C 18/405* (2013.01); *C25D 9/04* (2013.01); *H01B 3/441* (2013.01); *H01B 7/0275* (2013.01); *H01B 13/22* (2013.01); *H05K 9/0081* (2013.01)

(58) Field of Classification Search
USPC ........................................ 174/105 R, 102 SC
See application file for complete search history.

(56) References Cited

U.S. PATENT DOCUMENTS

| | | | |
|---|---|---|---|
| 4,035,565 A | 7/1977 | Apotheker et al. | |
| 4,243,770 A | 1/1981 | Tatemoto et al. | |
| 4,281,092 A | 7/1981 | Breazeale | |
| 4,510,346 A | 4/1985 | Bursh, Jr. et al. | |
| 4,548,867 A * | 10/1985 | Ueno | C08J 7/123 |
| | | | 204/169 |
| 4,564,662 A | 1/1986 | Albin | |
| 4,694,045 A | 9/1987 | Moore | |
| 4,745,165 A | 5/1988 | Arcella et al. | |
| 4,943,622 A | 7/1990 | Naraki et al. | |
| 5,173,553 A | 12/1992 | Albano et al. | |
| 5,447,993 A | 9/1995 | Logothetis | |
| 5,789,489 A | 8/1998 | Coughlin et al. | |
| 6,893,681 B2 * | 5/2005 | Cooray | H01B 1/122 |
| | | | 174/102 C |
| 2010/0034504 A1 * | 2/2010 | Aten | B32B 7/12 |
| | | | 385/123 |
| 2012/0009438 A1 | 1/2012 | Dams et al. | |
| 2013/0168126 A1 * | 7/2013 | Kuchta | H01B 7/361 |
| | | | 174/102 SC |
| 2016/0137828 A1 * | 5/2016 | Gurevich | C08L 27/18 |
| | | | 525/200 |
| 2016/0343474 A1 * | 11/2016 | Nichols | H01B 11/20 |

FOREIGN PATENT DOCUMENTS

| | | |
|---|---|---|
| JP | 2008084810 A2 | 4/2008 |
| JP | 2009170113 A2 | 7/2009 |
| WO | WO 2008-130557 | * 10/2008 |

* cited by examiner

SHIELDED CABLES

CROSS-REFERENCE TO RELATED APPLICATION

This application is a U.S. national stage entry under 35 U.S.C. § 371 of International Application No. PCT/EP2018/063728 filed May 24, 2018, which claims priority to U.S. provisional application No. 62/512,376, filed on May 30, 2017, and to European application No. 18153301.9, filed on Jan. 24, 2018. The entire contents of these applications are explicitly incorporated herein by this reference.

TECHNICAL FIELD

The present invention relates to a cable, suitable for both electric and data transmission, comprising at least one shield layer, comprising a metal layer directly adhering onto the polymeric layer.

BACKGROUND ART

Shielding is an effective method of protecting the cables from electrical and magnetic disturbances, which arise from external sources and which result, for example, in noise.

In particular, in recent years, the use of shielding for small pair size cables—in which a high signal-to-noise ratio is desirable—had greatly increased.

The shielding not only prevents the external disturbances from adversely affecting the signal carried by the core conductors, but it is also intended to prevent leakage of energy from the core to the environment.

Conventionally, shielding has been provided by means of a metallic braiding woven around the core or by a metal foil wrapped spirally around the core.

However, metallic braiding is relatively expensive and its use causes an increase of the diameter of the final cable, which is not desirable in certain applications. Also, the metallic braising does not provide a full coverage of the core and its effectiveness decreases, particularly at high frequencies.

Foil-type shields are more effective than metallic braiding. However, as the metal layer is very thin, it is coupled with a plastic material, typically made from polyethylene terephthalate, such as MYLAR® plastic commercially available from DuPont, which strengthens the metal layer and allows it to be processed. This procedure is complex and hence expensive on industrial scale.

In the art, shielding cables and processes for their manufacture have been disclosed for example in U.S. Pat. No. 4,510,346 (AT) and US 20120103648 (YAZAKI CORPORATION).

SUMMARY OF INVENTION

The Applicant faced the problem to provide a cable comprising a layer able of providing shielding effect from electrical and magnetic disturbances, as well as grounding.

The Applicant also faced the problem to provide a cable comprising a layer able of providing a barrier to the entry of gas and liquids and/or to chemical attack or corrosion.

The Applicant also faced the problem to provide a cable comprising a layer having the above mentioned properties, which at the same time can be manufactured via a convenient and simple process.

The Applicant surprisingly found that it is possible to provide a shielded cable comprising at least one layer made from a composition comprising at least one melt-processable polymer, said layer having a metal layer directly adhered thereto.

Thus, in a first aspect, the present invention relates to a cable [cable (C)] comprising at least one cable core and at least one shield layer [layer (S)] surrounding said cable core, characterized in that said at least one layer (S) is made from a composition [composition $(C_P)$] comprising at least one melt-processable polymer [polymer (P)] and has an inner surface [surface $(S_i)$] and an outer surface [surface $(S_o)$] with respect to the position of the cable core, said surface $(S_o)$ comprising at least one layer [layer $(L_M)$] comprising at least one metal compound [compound (M)].

The Applicant surprisingly found that layer (S) according to the present invention can be manufactured directly around the cable core or any other layer of said cable (C), in a one-step process, for example during the extrusion of said composition $(C_P)$.

Then, in a second aspect, the present invention relates to a method for the manufacture of a cable [cable (C)] for electric or data transmission comprising at least one shield layer [layer (S)], said method comprising the following steps:

(i) providing a composition [composition $(C_P)$] comprising at least one melt-processable polymer [polymer (P)];

(ii) processing said composition $(C_P)$ to provide a layer [layer (P)] having an internal surface $(S_i)$ and an external surface $(S_e)$;

(iii) forming nitrogen-containing groups [groups (N)] onto said surface $(S_e)$; (iv) contacting said surface $(S_e)$ as obtained in step (iii) with a first composition [composition (C1)] comprising at least one metallization catalyst; and (v) contacting said surface $(S_e)$ as obtained in step (iv) with a second composition [composition (C2)] containing at least one metal compound [compound (M1)], so as to provide a cable (C) comprising at least one layer (S) having an internal surface [surface $(S_i)$] and an outer surface [surface $(S_o)$], wherein said surface $(S_o)$ comprises at least one metal compound [compound (M)].

According to a preferred embodiment, the above method further comprises after said step (i) and before said step (ii), step $(i_b)$ of providing at least one metal conductor. According to this preferred embodiment, step (ii) is hence performed by processing said composition $(C_P)$ to surround said at least one metal conductor.

Optionally, the method according to the present invention further comprises after step $(i_b)$ and before step (ii), step $(i_c)$ of forming at least one layer [layer $(C_1)$] in contact and surrounding said at least one metal conductor.

If required by the intended use of said cable (C), the method according to the present invention comprises further steps of forming at least one additional layer, for example at least one layer in direct contact and surrounding surface $(S_o)$ of said layer (S).

DESCRIPTION OF EMBODIMENTS

Figure 1:
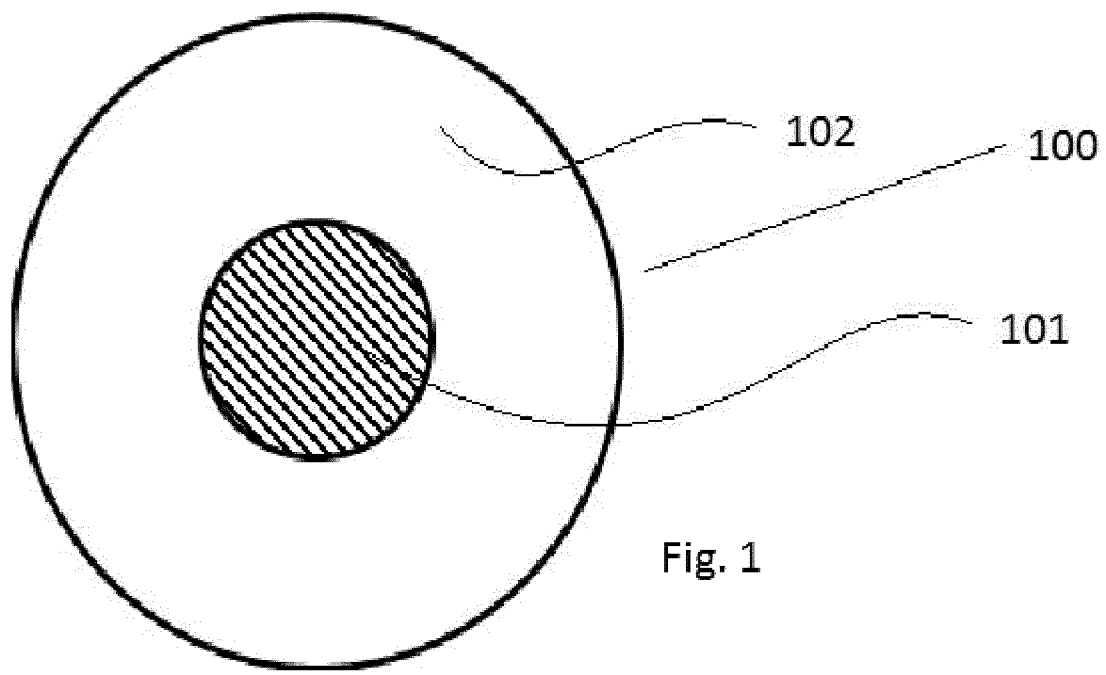
FIG. 1 is a cross-sectional view of a first embodiment of a generic cable.

For the purposes of the present description and of the following claims:
- the use of parentheses before and after symbols or numbers identifying compounds, chemical formulae or parts of formulae has the mere purpose of better distinguishing those symbols or numbers from the rest of the text and hence said parentheses can also be omitted;
- the expression "melt-processable" is intended to indicate a polymer that can be processed (i.e., fabricated) into shaped articles (such as tubes, wire coatings, and the like) at a temperature higher than its glass transition temperature ($T_g$). The expression "melt-processable" is herein intended to comprise (A) elastomeric polymer, before the curing step, (B) semi-crystalline polymers, (C) polymers comprising both elastomeric and semi-crystalline segments, and (D) amorphous polymers having glass transition temperature (Tg) of at least 170° C., more preferably of at least 175° C., even more preferably in the range from 175° C. to 250° C.;
- the expression "semi-crystalline" referred to the polymer or to the segment is intended to indicate a polymer or a segment of a polymer having a heat of fusion of more than 1 J/g when measured by Differential Scanning Calorimetry (DSC) at heating rate of 10°/min, according to ASTM D-3418; more preferably from 35 J/g to 1 J/g, even more preferably from 15 to 5 J/g;
- the term "elastomer" is intended to indicate amorphous polymers or polymers having a low degree of crystallinity (crystalline phase being less than 20% by volume) and a glass transition temperature ($T_g$), measured according to ASTM D3418, below room temperature. More preferably, the elastomer according to the invention has a $T_g$ below 10° C., even more preferably below 5° C., as measured according to ASTM D3418;
- the term "perfluoropolymer" and the expression "fully fluorinated polymer" are used as synonyms and are intended to indicate a polymer consisting essentially of recurring units derived from at least one perfluorinated monomer;
- the expression "consisting essentially of" is intended to indicate that minor amounts of end chains, defects, irregularities and monomer rearrangements are tolerated in the perfluoropolymer, provided that their amount is below 5 moles % based on the total moles of the final perfluoropolymer, more preferably below 2 moles %;
- the expression "at least one perfluorinated monomer" is intended to indicate that the perfluoropolymer contains recurring units derived from one or more perfluorinated monomers.

Preferably, said compound (M) comprises at least one metal selected from the group consisting of: Rh, Ir, Ru, Ti, Re, Os, Cd, Tl, Pb, Bi, In, Sb, Al, Ti, Cu, Ni, Pd, V, Fe, Cr, Mn, Co, Zn, Mo, W, Ag, Au, Pt, Ir, Ru, Pd, Sn, Ge, Ga and alloys thereof.

More preferably, said compound (M) comprises at least one metal selected from the group consisting of Ni, Cu, Pd, Co, Ag, Au, Pt, Sn and alloys thereof. Even more preferably, said compound (M) comprises Cu and Pd.

The thickness of said layer ($L_M$) is not particularly limited. Preferably, said layer ($L_M$) has a thickness of from 1 nm to 1 mm, more preferably from 10 nm to 0.1 mm.

Preferably, said layer ($L_M$) is a continuous layer, i.e., it completely covers said surface (S). However, embodiments wherein said layer ($L_M$) is a discontinuous layer, partially covering said surface (S), i.e. said surface (S) comprises at least one area that is not covered by said layer ($L_M$), are also encompassed by the present invention.

Preferably, said surface ($S_o$) further comprises at least one nitrogen-containing group [group (N)]. Advantageously, said group (N) forms chemical bonds with both polymer (P) and compound (M).

The expression "chemical bonds" is intended to indicate any type of chemical bond, such as covalent bond, ionic bond, dipolar (or coordinate bond), between at least part of said group(s) (N) and both polymer (P) and compound (M).

Preferably, said group (N) is selected from the groups comprising, more preferably consisting of: amino, amido, urethano, urea, silazanyl (i.e., radical of silazane), aziridine, azide, anilinyl (i.e, radical of aniline), pyrrolyl (i.e., radical of pyrrole), pyridinyl (i.e., radical of pyridine), imine and nitrile.

More preferably, said group (N) is selected from the group comprising, even more preferably consisting of: allylamine, hexadimethylsilazane (HMDSN), pyrrolidine, pyrrole, acetonitrile, aniline.

Preferably, said composition ($C_P$) comprises at least one melt-processable polymer [polymer (P)].

Said composition ($C_P$) can contain further ingredients, such as for example, inorganic and polymeric filler(s).

Suitable inorganic fillers are selected for example from talc, glass fibre, carbon fibre, wollastonite, and metal-oxy-sulfate (MOS). Organic fillers are selected for example from elastomers or rubbers, such as ethylene propylene rubber (EPR), ethylene-propylene-diene rubber (EPDM), ethylene-octene, ethylbenzene, and styrene-ethylene-butadiene-styrene (SEBS).

Preferably, said composition ($C_P$) comprises from 10 to 100 wt. %, more preferably from 20 to 100 wt. % and even more preferably from 35 to 100 wt. % of said polymer (P), based on the total weight of said composition ($C_P$).

Preferably said composition ($C_P$) comprises from 0.01 wt. % up to 90 wt. %, more preferably up to 80 wt. % and even more preferably up to 65 wt. %, of one or more further ingredients as defined above.

Preferably, said polymer (P) has a melt viscosity at the processing temperature be no more than $10^8$ Pa×sec, preferably from 10 to $10^6$ Pa×sec. Advantageously, the melt-viscosity of polymer (P) can be measured according to ASTM D-1238, using a cylinder, orifice and piston tip made of a corrosion-resistant alloy, charging a sample into the 9.5 mm inside diameter cylinder which is maintained at a temperature exceeding the melting point, extruding the sample through a 2.10 mm diameter, 8.00 mm long square-edged orifice under a load (piston plus weight) of 5 Kg. The melting viscosity (or melt flow index, MFI) is expressed as extrusion rate in grams per minute or alternatively can be calculated in "Pa×sec" from the observable extrusion rate in grams per minute.

Preferably, said polymer (P) has a melt flow index comprised between 0.01 and 100 g/10 min, more preferably between 0.1 and 80 g/10 min, even more preferably between 0.5 and 50 g/10 min, as measured according to ASTM D1238, using a load of 5 kg and a temperature value selected on the basis of the melting point of the polymer (P).

Preferably, said polymer (P) has a peak melting temperature (Tm) of at most 325° C., more preferably of at most 315° C. Preferably, said polymer (P) has a peak melting temperature of at least 120° C., more preferably of at least 140° C. More preferably, said polymer (P) has a peak melting temperature (Tm) between 160° C. and 320° C., even more preferably between 180 and 315° C. The melting temperature is determined by Differential Scanning Calorimetry (DSC), at a heating rate of 10° C./min, according to ASTM D3418.

Preferably, said polymer (P) is selected from the group comprising, more preferably consisting of: polyolefins, polyamides, (per)fluorinated polymers.

Preferably, said polyolefin is selected in the group comprising, more preferably consisting of: polypropylene (PP), polyethylene (PE), block copolymer polypropylene (BCPP), polybutylene, polymethylpentene, and mixtures thereof.

Preferably, said polyamide is selected in the group comprising, more preferably consisting of: aliphatic polyamides, such as PA4, PA6, PA11, PA12, PA66 and co-polymers and mixtures thereof; semi-aromatic polyamides, such as PA6T (deriving from hexamethylendiamine and terephthalic acid); and aromatic polyamides, such as poly para-phenylene terephthalamide, poly meta-phenylene isophthalamide; and mixtures and co-polymers thereof.

Preferably, said (per)fluorinated polymer is selected in the group comprising, preferably consisting of: partially fluorinated polymers, such as ethylene-tetrafluoroethylene (ETFE); and perfluoropolymer.

Non-limitative examples of suitable perfluorinated monomers are notably:

$C_2$-$C_8$ perfluoroolefins, such as tetrafluoroethylene (TFE) and hexafluoropropene (HFP);

chloro- and/or bromo- and/or iodo-$C_2$-$C_6$ fluoroolefins, such as chlorotrifluoroethylene (CTFE);

$CF_2$=$CFOR_{f1}$, wherein $R_{f1}$ is a $C_1$-$C_6$ perfluoroalkyl group, such as $CF_3$, $C_2F_5$, $C_3F_7$, or a group of formula —$CFOCF_2OR_{f2}$ wherein $R_{f2}$ is a $C_1$-$C_6$ perfluoroalkyl group, e.g. $CF_3$, $C_2F_5$, $C_3F_7$, a cyclic $C_5$-$C_6$ perfluoroalkyl group, or a $C_1$-$C_{12}$ (per)fluorooxyalkyl group comprising one or more ether groups, such as —$C_2F_5$—O—$CF_3$;

perfluorodioxoles of formula:

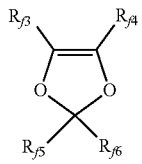

wherein each of $R_{f3}$, $R_{f4}$, $R_{f5}$, $R_{f6}$, equal of different each other, is independently a fluorine atom, a $C_1$-$C_6$ perfluoroalkyl group, optionally comprising one or more oxygen atom, e.g. —$CF_3$, —$C_2F_5$, —$C_3F_7$, —$OCF_3$, —$OCF_2CF_2OCF_3$.

According to a first variant, said polymer (P) is selected from semi-crystalline perfluoro-polymers [polymer ($P_{SC}$)].

Preferably, said polymer ($P_{SC}$) is a copolymer of tetrafluoroethylene (TFE), i.e. it comprises recurring units derived from TFE and recurring units derived from at least one perfluorinated monomer different from TFE [co-monomer (F)].

The term "copolymer" is intended to indicate polymers comprising recurring units derived from TFE and recurring units derived from two, three, four or higher, such as up to 10, perfluorinated monomers different from TFE.

More preferably, said at least one co-monomer (F) is selected from the group consisting of:

(i) $C_3$-$C_8$ perfluoroolefins, such as hexafluoropropene (HFP);

(ii) $CF_2$=$CFOR_{f1}$, wherein $R_{f1}$ is a $C_1$-$C_6$ perfluoroalkyl group, such as $CF_3$, $C_2F_5$, $C_3F_7$, a cyclic $C_5$-$C_6$ perfluoroalkyl group, or a $C_1$-$C_{12}$ (per)fluorooxyalkyl group comprising one or more ether groups, such as —$C_2F_5$—O—$CF_3$;

(iii) perfluorodioxoles of formula:

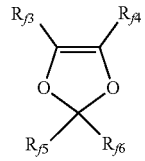

wherein each of $R_{f3}$, $R_{f4}$, $R_{f5}$, $R_{f6}$, equal of different each other, is independently a fluorine atom, a $C_1$-$C_6$ perfluoroalkyl group, optionally comprising one or more oxygen atom, e.g. —$CF_3$, —$C_2F_5$, —$C_3F_7$, —$OCF_3$, —$OCF_2CF_2OCF_3$; and (iv) combinations of (i) to (iii) above.

Even more preferably, said at least one co-monomer (F) is selected from the group consisting of:

(i) hexafluoropropene (HFP);

(ii) $CF_2$=$CFOR_{f1}$, wherein $R_{f1}$ is selected from:

($R_{f1}$*) —$CF_3$, —$C_2F_5$, and —$C_3F_7$, namely, perfluoromethylvinylether (PMVE of formula $CF_2$=$CFOCF_3$), perfluoroethylvinylether (PEVE of formula $CF_2$=$CFOC_2F_5$), perfluoropropylvinylether (PPVE of formula $CF_2$=$CFOC_3F_7$), and combinations thereof;

($R_{f1}$**) —$CF_2OR_{f2}$, wherein $R_{f2}$ is a linear or branched $C_1$-$C_6$ perfluoroalkyl group, cyclic $C_5$-$C_6$ perfluoroalkyl group, a linear or branched $C_2$-$C_6$ perfluorooxyalkyl group; preferably, $R_{f2}$ is —$CF_2CF_3$ (MOVE1), —$CF_2CF_2OCF_3$ (MOVE2), or —$CF_3$ (MOVE3); and combinations thereof.

Preferably, polymer ($P_{SC}$) comprises at least 0.6 wt. %, preferably at least 0.8 wt. %, more preferably at least 1 wt. % of recurring units derived from said at least one co-monomer (F).

Preferably, polymer ($P_{SC}$) comprises at most 70 wt. %, preferably at most 60 wt. %, more preferably at most 40 wt. % of recurring units derived from said at least one co-monomer (F).

In a preferred embodiment of the first variant, said polymer ($P_{SC}$) is a TFE copolymer consisting essentially of:

(I) from 5 wt. % to 25 wt. % of recurring units derived PMVE; and (II) recurring units derived from TFE, in such an amount that the sum of the percentages of the recurring units (I) and (II) is equal to 100% by weight.

In another preferred embodiment of the first variant, said polymer ($P_{SC}$) is a TFE copolymer consisting essentially of:

(I) from 5 wt. % to 25 wt. % of recurring units derived from PMVE;

(II) from 0.5 wt. % to 5 wt. % of recurring units derived from PPVE; and (III) recurring units derived from TFE, in such an amount that the sum of the percentages of the recurring units (I), (II) and (III) is equal to 100% by weight.

In still another preferred embodiment, said polymer ($P_{SC}$) is a TFE copolymer consisting essentially of:

(I) from 1 wt. % to 25 wt. % of recurring units derived PPVE; and (II) recurring units derived from TFE, in such an amount that the sum of the percentages of the recurring units (I) and (II) is equal to 100% by weight.

Suitable polymers ($P_{SC}$) for the present invention are commercially available from Solvay Specialty Polymers Italy S.p.A. under the trade name of HYFLON® PFA P and M series and HYFLON® MFA.

According to a second variant, said polymer (P) is a (per)fluoroelastomer [polymer ($P_{PFE}$)], which comprises recurring units derived from the (per)fluorinated monomers cited above and, optionally, one or more cure sites, either as pendant groups bonded to certain recurring units or as ends groups of the polymer chain.

The prefix "(per)" in the expression "(per)fluorinated monomer" and in the term "(per)fluoroelastomer" means that the monomer or the elastomer can be fully or partially fluorinated.

Preferably, said (per)fluorinated monomers are selected from the group comprising, more preferably consisting of:

$C_2$-$C_8$ perfluoroolefins, such as tetrafluoroethylene (TFE) and hexafluoropropene (HFP);

$C_2$-$C_8$ hydrogenated fluoroolefins, such as vinylidene fluoride (VDF), vinyl fluoride, 1,2-difluoroethylene and trifluoroethylene (TrFE);

chloro- and/or bromo- and/or iodo-$C_2$-$C_6$ fluoroolefins, such as chlorotrifluoroethylene (CTFE);

$CH_2$=CH—$R_{f0}$ wherein $R_{f0}$ is a $C_1$-$C_6$ (per)fluoroalkyl or a $C_1$-$C_6$ (per)fluorooxyalkyl having one or more ether groups;

$CH_2$=CFOR$_{f1}$, wherein $R_{f1}$ is a $C_1$-$C_6$ fluoro- or perfluoroalkyl group, such as $CF_3$, $O_2F_5$, $C_3F_7$;

$CF_2$=CFOR$_{f2}$, wherein $R_{f2}$ is $C_1$-$C_{12}$ alkyl or (per)fluoroalkyl group, such as $CF_3$, $C_2F_5$, $C_3F_7$; $C_1$-$C_{12}$ oxyalkyl; $C_1$-$C_{12}$ (per)fluorooxyalkyl group, optionally comprising one or more ether groups, such as perfluoro-2-propoxy-propyl; a group of formula —$CF_2OR_{f3}$ in which $R_{f3}$ is a $C_1$-$C_6$ fluoro- or perfluoroalkyl or a $C_1$-$C_6$ (per)fluorooxyalkyl group comprising one or more ether groups, such as —$C_2F_5$—O—$CF_3$; or $R_{f2}$ comprises a carboxylic or sulfonic acid group, in its acid, acid halide or salt form;

fluorodioxoles, such as perfluorodioxoles;

fluorosilanes, such as $CF_3$—$C_2H_4$—Si($R_{f5}$)$_3$ or Ar—Si($R_{f5}$)$_3$ wherein each of $R_{f5}$ is independently selected from Cl, $C_1$-$C_3$ alkyl or $C_1$-$C_3$ alkoxy, and Ar is a phenyl ring optionally substituted with a $C_1$-$C_6$ fluoro- or perfluoroalkyl group, e.g. $CF_3$, $C_2F_5$, $C_3F_7$ or a $C_1$-$C_6$ (per)fluorooxyalkyl group comprising one or more ether groups, such as —$C_2F_5$—O—$CF_3$; and $CH_2$=$CH_2$—Si($R_{f6}$)$_3$ wherein each of $R_{f6}$ is independently selected from H, F and $C_1$-$C_3$ alkyl, provided that at least one of said $R_{f5}$ is F.

More preferably, said (per)fluoro-elastomer comprises recurring units derived from:

$C_2$-$C_8$ perfluoroolefins, such as tetrafluoroethylene (TFE) and hexafluoropropene (HFP);

$C_2$-$C_8$ hydrogenated fluoroolefins, such as vinylidene fluoride (VDF), vinyl fluoride, 1,2-difluoroethylene and trifluoroethylene (TrFE);

$CF_2$=CFOR$_{f1}$, wherein $R_{f1}$ is a $C_1$-$C_6$ fluoro- or perfluoroalkyl group, such as $CF_3$, $C_2F_5$, $C_3F_7$, or a group of formula —CFOCF$_2$OR$_{f2}$ wherein $R_{f2}$ is a $C_1$-$C_6$ fluoro- or perfluoroalkyl group, e.g. $CF_3$, $C_2F_5$, $C_3F_7$;

fluorosilanes, such as $CF_3$—$C_2H_4$—Si($R_{f3}$)$_3$ wherein each of $R_{f3}$ is independently selected from Cl, $C_1$-$C_3$ alkyl or $C_1$-$C_3$ alkoxy, and $CH_2$=$CH_2$—Si($R_{f4}$)$_3$ wherein each of $R_{f4}$ is selected from H, F and $C_1$-$C_3$ alkyl.

Optionally, said (per)fluoroelastomer further comprises recurring units derived from at least one bis-olefin.

Non limiting examples of suitable bis-olefins are selected from those of formulae below:

$R_1R_2C$=CH—($CF_2$)$_j$—CH=$CR_3R_4$ wherein j is an integer between 2 and 10, preferably between 4 and 8, and $R_1$, $R_2$, $R_3$, $R_4$, equal or different from each other, are —H, —F or $C_1$-$C_{05}$ alkyl or (per)fluoroalkyl group;

$A_2C$=CB—O-E-O—CB=$CA_2$ wherein each of A, equal or different from each other, is independently selected from —F, —Cl, and —H; each of B, equal or different from each other is independently selected from —F, —Cl, —H and —OR$_B$, wherein $R_B$ is a branched or straight chain alkyl radical which can be partially, substantially or completely fluorinated or chlorinated; E is a divalent group having 2 to 10 carbon atoms, optionally fluorinated, which may be inserted with ether linkages; preferably E is a —($CF_2$)$_z$— group, with z being an integer from 3 to 5; and $R_6R_7C$=CR$_5$-E-O—CB=$CA_2$, wherein E, A and B have the same meaning as above defined; $R_5$, $R_6$, $R_7$, equal or different from each other, are —H, —F or $C_1$-$C_5$ alkyl or fluoroalkyl group.

When a bis-olefin is employed, the resulting (per)fluoroelastomer typically comprises from 0.01% to 5% by moles of units deriving from the bis-olefin with respect to the total amount of units in the polymer.

Optionally, said (per)fluoroelastomer may comprise cure sites, either as pendant groups bonded to certain recurring units or as ends groups of the polymer chain, said cure sites comprising at least one iodine or bromine atom, more preferably at least one iodine atom.

Among cure-site containing recurring units, mention can be notably made of:

(CSM-1) iodine or bromine containing monomers of formula:

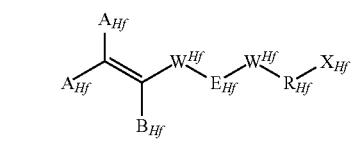

wherein each of $A_{Hf}$, equal to or different from each other and at each occurrence, is independently selected from F, Cl, and H; $B_{Hf}$ is any of F, Cl, H and OR$^{Hf}_B$, wherein $R^{Hf}_B$ is a branched or straight chain alkyl radical which can be partially, substantially or completely fluorinated or chlorinated; each of $W^{Hf}$ equal to or different from each other and at each occurrence, is independently a covalent bond or an oxygen atom; $E_{Hf}$ is a divalent group having 2 to 10 carbon atom, optionally fluorinated; $R_{Hf}$ is a branched or straight chain alkyl radical, which can be partially, substantially or completely fluorinated; and $R_{Hf}$ is a halogen atom selected from the group consisting of Iodine and Bromine; which may be inserted with ether linkages; preferably E is a —($CF_2$)$_m$— group, with m being an integer from 3 to 5;

(CSM-2) ethylenically unsaturated compounds comprising cyanide groups, possibly fluorinated.

Among cure-site containing monomers of type (CSM1), preferred monomers are those selected from the group consisting of:

(CSM1-A) iodine-containing perfluorovinylethers of formula:

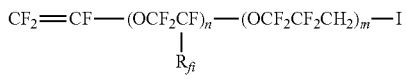

with m being an integer from 0 to 5 and n being an integer from 0 to 3, with the provision that at least one of m and n is different from 0, and $R_{fi}$ being F or $CF_3$; (as notably described in U.S. Pat. No. 4,745,165 (AUSIMONT SPA), U.S. Pat. No. 4,564,662 (MINNESOTA MINING) and EP 199138 (DAIKIN IND LTD); and (CSM-1B) iodine-containing ethylenically unsaturated compounds of formula:

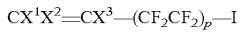

wherein each of $X^1$, $X^2$ and $X^3$, equal to or different from each other, are independently H or F; and p is an integer from 1 to 5; among these compounds, mention can be made of $CH_2$=$CHCF_2CF_2I$, $I(CF_2CF_2)_2CH$=$CH_2$, $ICF_2CF_2CF$=$CH_2$, $I(CF_2CF_2)_2CF$=$CH_2$;

(CSM-1C) iodine-containing ethylenically unsaturated compounds of formula:

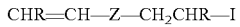

wherein R is H or $CH_3$, Z is a $C_1$-$C_{18}$ (per)fluoroalkylene radical, linear or branched, optionally containing one or more ether oxygen atoms, or a (per)fluoropolyoxyalkylene radical; among these compounds, mention can be made of $CH_2$=$CH$—$(CF_2)_4CH_2CH_2I$, $CH_2$=$CH$—$(CF_2)_6CH_2CH_2I$, $CH_2$=$CH$—$(CF_2)_8CH_2CH_2I$, $CH_2$=$CH$—$(CF_2)_2CH_2CH_2I$;

(CSM-1D) bromo and/or iodo alpha-olefins containing from 2 to 10 carbon atoms such as bromotrifluoroethylene or bromotetrafluorobutene described, for example, in U.S. Pat. No. 4,035,565 (DU PONT) or other compounds bromo and/or iodo alpha-olefins disclosed in U.S. Pat. No. 4,694,045 (DU PONT).

Among cure-site containing monomers of type (CSM2), preferred monomers are those selected from the group consisting of:

(CSM2-A) perfluorovinyl ethers containing cyanide groups of formula $CF_2$=$CF$—$(OCF_2CFX^{CN})_m$—$O$—$(CF_2)_n$—$CN$, with $X^{CN}$ being F or $CF_3$, m being 0, 1, 2, 3 or 4; n being an integer from 1 to 12;

(CSM2-B) perfluorovinyl ethers containing cyanide groups of formula $CF_2$=$CF$—$(OCF_2CFX^{CN})_{m'}$—$O$—$CF_2$—$CF(CF_3)$—$CN$, with $X^{CN}$ being F or $CF_3$, m' being 0, 1, 2, 3 or 4.

Specific examples of cure-site containing monomers of type CSM2-A and CSM2-B suitable to the purposes of the present invention are notably those described in U.S. Pat. No. 4,281,092 (DU PONT), U.S. Pat. No. 5,447,993 (DU PONT) and U.S. Pat. No. 5,789,489 (DU PONT).

Preferably, said (per)fluoroelastomer comprises iodine or bromine cure sites in an amount of 0.001 to 10% wt. Among these, iodine cure sites are those selected for maximizing curing rate, so that (per)fluoroelastomers comprising iodine cure-sites are preferred.

According to this embodiment, for ensuring acceptable reactivity it is generally understood that the content of iodine and/or bromine in the (per)fluoroelastomer should be of at least 0.05% wt., preferably of at least 0.1% wt., more preferably of at least 0.15% wt., with respect to the total weight of the (per)fluoroelastomer.

On the other side, amounts of iodine and/or bromine not exceeding preferably 7% wt., more specifically not exceeding 5% wt., or even not exceeding 4% wt., with respect to the total weight of the (per)fluoroelastomer, are those generally selected for avoiding side reactions and/or detrimental effects on thermal stability.

These iodine or bromine cure sites of these preferred embodiments of the invention might be comprised as pending groups bound to the backbone of the (per)fluoroelastomer polymer chain (by means of incorporation in the (per)fluoroelastomer chain of recurring units derived from monomers of (CSM-1) type, as above described, and preferably of monomers of (CSM-1A) to (CSM1-D), as above detailed) or might be comprised as terminal groups of said polymer chain.

According to a first embodiment, the iodine and/or bromine cure sites are comprised as pending groups bound to the backbone of the (per)fluoroelastomer polymer chain. The (per)fluoroelastomer according to this embodiment generally comprises recurring units derived from iodine or bromine containing monomers (CSM-1) in amounts of 0.05 to 5 mol per 100 mol of all other recurring units of the (per)fluoroelastomer, so as to advantageously ensure above mentioned iodine and/or bromine weight content.

According to a second preferred embodiment, the iodine and/or bromine cure sites are comprised as terminal groups of the (per)fluoroelastomer polymer chain; the fluoroelastomer according to this embodiment is generally obtained by addition to the polymerization medium during fluoroelastomer manufacture of anyone of:

iodinated and/or brominated chain-transfer agent(s); suitable chain-chain transfer agents are typically those of formula $R_f(I)_x(Br)_y$, in which $R_f$ is a (per)fluoroalkyl or a (per)fluorochloroalkyl containing from 1 to 8 carbon atoms, while x and y are integers between 0 and 2, with 1≤x+y≤2 (see, for example, U.S. Pat. No. 4,243,770 (DAIKIN IND LTD) and U.S. Pat. No. 4,943,622 (NIPPON MEKTRON KK); and alkali metal or alkaline-earth metal iodides and/or bromides, such as described notably in U.S. Pat. No. 5,173,553 (AUSIMONT SRL).

Among specific compositions of said (per)fluoroelastomer, which are suitable for the purpose of the present invention, mention can be made of fluoroelastomers having the following compositions (in mol %):

(i) vinylidene fluoride (VDF) 35-85%, hexafluoropropene (HFP) 10-45%, tetrafluoroethylene (TFE) 0-30%, perfluoroalkyl vinyl ethers (PAVE) 0-15%, bis-olefin (OF) 0-5%;

(ii) vinylidene fluoride (VDF) 50-80%, perfluoroalkyl vinyl ethers (PAVE) 5-50%, tetrafluoroethylene (TFE) 0-20%, bis-olefin (OF) 0-5%;

(iii) vinylidene fluoride (VDF) 20-30%, $C_2$-$C_8$ non-fluorinated olefins (01) 10-30%, hexafluoropropene (HFP) and/or perfluoroalkyl vinyl ethers (PAVE) 18-27%, tetrafluoroethylene (TFE) 10-30%, bis-olefin (OF) 0-5%;

(iv) tetrafluoroethylene (TFE) 50-80%, perfluoroalkyl vinyl ethers (PAVE) 20-50%, bis-olefin (OF) 0-5%;

(v) tetrafluoroethylene (TFE) 45-65%, $C_2$-$C_8$ non-fluorinated olefins (01) 20-55%, vinylidene fluoride 0-30%, bis-olefin (OF) 0-5%;

(vi) tetrafluoroethylene (TFE) 32-60% mol %, $C_2$-$C_8$ non-fluorinated olefins (OI) 10-40%, perfluoroalkyl vinyl ethers (PAVE) 20-40%, fluorovinyl ethers (MOVE) 0-30%, bis-olefin (OF) 0-5%;

(vii) tetrafluoroethylene (TFE) 33-75%, perfluoroalkyl vinyl ethers (PAVE) 15-45%, vinylidene fluoride (VDF) 5-30%, hexafluoropropene HFP 0-30%, bis-olefin (OF) 0-5%;

(viii) vinylidene fluoride (VDF) 35-85%, fluorovinyl ethers (MOVE) 5-40%, perfluoroalkyl vinyl ethers (PAVE) 0-30%, tetrafluoroethylene (TFE) 0-40%, hexafluoropropene (HFP) 0-30%, bis-olefin (OF) 0-5%;

(ix) tetrafluoroethylene (TFE) 20-70%, fluorovinyl ethers (MOVE) 30-80%, perfluoroalkyl vinyl ethers (PAVE) 0-50%, bis-olefin (OF) 0-5%.

More preferred (per)fluoroelastomers are those comprising vinylidene fluoride (VDF) 35-85%, hexafluoropropene (HFP) 10-45%, tetrafluoroethylene (TFE) 0-30%, perfluoroalkyl vinyl ethers (PAVE) 0-15%, bis-olefin (OF) 0-5%.

Suitable examples of (per)fluoroelastomers are commercially available from SOLVAY SPECIALTY POLYMERS ITALY S.p.A. under the trade name Tecnoflon® PFR, such as for example Tecnoflon® P757 and Tecnoflon® FOR 539.

According to a third variant, said polymer (P) is a perfluorinated thermoplastic elastomer [polymer ($P_{TPE}$)] comprising:

at least one elastomeric block (A) consisting of a sequence of recurring units derived from tetrafluoroethylene (TFE) and recurring units derived from at least one perfluorinated monomer other than TFE, and possibly of a minor amount of recurring units derived from at least one bis-olefin [bis-olefin (OF)] of formula $R_A R_B C = CR_C - T - CR_D = R_E R_F$, wherein $R_A$, $R_B$, $R_C$, $R_D$, $R_E$ and $R_F$, equal to or different from each other, are selected from the group consisting of H, F, Cl, $C_1$-$C_5$ alkyl groups and $C_1$-$C_5$ (per)fluoroalkyl groups, and T is a linear or branched $C_1$-$C_{18}$ alkylene or cycloalkylene group, optionally comprising one or more than one ethereal oxygen atom, preferably at least partially fluorinated, or a (per)fluoropolyoxyalkylene group, wherein the molar percentage of recurring units derived from TFE in said block (A) is comprised between 40 and 82% moles, with respect to the total moles of recurring units of the said block (A), and wherein said block (A) possesses a glass transition temperature of less than 25° C., as determined according to ASTM D3418, and at least one thermoplastic block (B) consisting of a sequence of recurring units derived from tetrafluoroethylene (TFE) and recurring units derived from at least one perfluorinated monomer other than TFE, wherein the molar percentage of recurring units derived from TFE in said block (B) is comprised between 85 and 98% moles, and wherein the crystallinity of said block (B) and its weight fraction in the polymer (pF-TPE) are such to provide for a heat of fusion of the polymer (pF-TPE) of at least 2.5 J/g, when determined according to ASTM D3418.

For the purpose of the present invention, the term "elastomeric", when used in connection with the "block (A)" is hereby intended to denote a polymer chain segment which, when taken alone, is substantially amorphous, that is to say, has a heat of fusion of less than 2.0 J/g, preferably of less than 1.5 J/g, more preferably of less than 1.0 J/g, as measured according to ASTM D3418.

For the purpose of the present invention, the term "thermoplastic", when used in connection with the "block (B)", is hereby intended to denote a polymer chain segment which, when taken alone, is semi-crystalline, and possesses a detectable melting point, with an associated heat of fusion of exceeding 10.0 J/g, as measured according to ASTM D3418.

Said polymer ($P_{TPE}$) can be referred to as a block copolymer, said block copolymer typically having a structure comprising at least one block (A) alternated to at least one block (B), that is to say that said polymer ($P_{TPE}$) typically comprises, preferably consists of, one or more than one repeating structures of type (B)-(A)-(B). Generally, polymer ($P_{TPE}$) has a structure of type (B)-(A)-(B), i.e. comprising a central block (A) having two ends, connected at both ends to a side block (B).

The said perfluorinated monomer other than TFE is advantageously selected from the group provided above for the co-monomer (F).

Preferably, the bis-olefin (OF), cited within the present description for the second and the third variant of the invention, is selected from the group consisting of those of any of formulae (OF-1), (OF-2) and (OF-3):

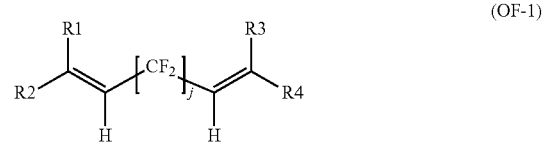

(OF-1)

wherein
j is an integer comprised between 2 and 10, preferably between 4 and 8, and
R1, R2, R3 and R4, equal to or different from each other, are selected from the group consisting of H, F, $C_1$-$C_5$ alkyl groups and $C_1$-$C_5$ (per)fluoroalkyl groups;

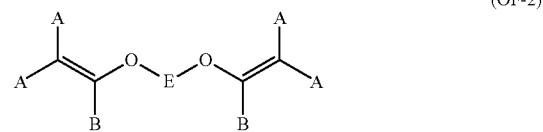

(OF-2)

wherein
each of A, equal to or different from each other and at each occurrence, is independently selected from the group consisting of H, F and Cl;
each of B, equal to or different from each other and at each occurrence, is independently selected from the group consisting of H, F, Cl and $OR_B$,
wherein $R_B$ is a branched or straight chain alkyl group which may be partially, substantially or completely fluorinated or chlorinated,
E is a divalent group having 2 to 10 carbon atoms, optionally fluorinated, which may be inserted with ether linkages; preferably E is a —$(CF_2)_m$— group, wherein m is an integer comprised between 3 and 5;
a preferred bis-olefin of (OF-2) type is $F_2C=CF-O-(CF_2)_5-O-CF=CF_2$;

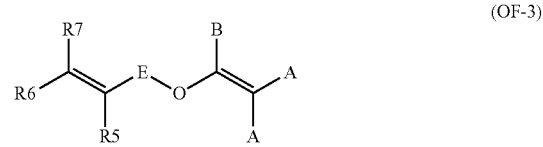

(OF-3)

wherein

E, A and B have the same meaning as defined above,

R5, R6 and R7, equal to or different from each other, are selected from the group consisting of H, F, $C_1$-$C_5$ alkyl groups and $C_1$-$C_5$ (per)fluoroalkyl groups.

The elastomeric block (A) preferably consists of a sequence of:
  recurring units derived from tetrafluoroethylene (TFE) in an amount of 40 to 82% moles, preferably from 50 to 75% moles, and most preferably from 54 to 70% moles;
  recurring units derived from at least one perfluorinated monomer other than TFE, as above detailed, in an amount of 18 to 55% moles, preferably from 25 to 48% moles, and most preferably from 30 to 45% moles; and
  possibly, recurring units derived from a bis-olefin (OF), as above detailed, in an amount of 0 to 5% moles, preferably of 0 to 2% moles, more preferably of 0 to 1% moles,
with respect to the total moles of recurring units of block (A)

The elastomeric block (A) possesses a glass transition temperature of less than 25° C., preferably of less than 20° C., more preferably of less than 15° C., as determined according to ASTM D3418.

The thermoplastic block (B) preferably consists of a sequence of:
  recurring units derived from tetrafluoroethylene (TFE) in an amount of 85 to 99.5% moles, preferably from 88 to 97% moles, and most preferably from 90 to 96% moles;
  recurring units derived from at least one perfluorinated monomer other than TFE, as above detailed, in an amount of 0.5 to 15% moles, preferably from 3 to 12% moles, and most preferably from 4 to 10% moles,
with respect to the total moles of recurring units of block (B).

The weight ratio between blocks (A) and blocks (B) in said polymer ($P_{TPE}$) is typically comprised between 95:5 and 10:90.

Said polymer ($P_{TPE}$) can be advantageously prepared by a method comprising the following sequential steps:

(a) polymerizing TFE, at least one perfluorinated monomer other than TFE, and possibly at least one bis-olefin (OF), in the presence of a radical initiator and of an iodinated chain transfer agent, thereby providing a pre-polymer consisting of at least one block (A) containing one or more iodinated end groups; and (b) polymerizing TFE, at least one perfluorinated monomer other than TFE, in the presence of a radical initiator and of the pre-polymer provided in step (a), thereby providing at least one block (B) grafted on said pre-polymer through reaction of the said iodinated end groups of the block (A).

The method of the invention is preferably carried out in aqueous emulsion polymerization according to methods well known in the art, in the presence of a suitable radical initiator.

The radical initiator is typically selected from the group consisting of:
  inorganic peroxides such as, for instance, alkali metal or ammonium persulphates, perphosphates, perborates or percarbonates, optionally in combination with ferrous, cuprous or silver salts or other easily oxidable metals;
  organic peroxides such as, for instance, disuccinylperoxide, tertbutyl-hydroperoxide, and ditertbutylperoxide; and
  azo compounds (see, for instance, U.S. Pat. No. 2,515,628 (E.I. DU PONT DE NEMOUS AND CO.) and U.S. Pat. No. 2,520,338 (E.I. DU PONT DE NEMOURS AND CO.).

When step (a) is terminated, the reaction is discontinued, for instance by cooling, and the residual monomers are removed, for instance by heating the emulsion under stirring.

The second polymerization step (b) is then carried out, feeding the new monomer mixture and adding fresh radical initiator.

If necessary, under step (b) of the process for the manufacture of the polymer ($P_{TPE}$), one or more further chain transfer agents may be added, which can be selected from the same iodinated chain transfer agents as defined above or from chain transfer agents known in the art for use in the manufacture of fluoropolymers such as, for instance, ketones, esters or aliphatic alcohols having from 3 to 10 carbon atoms, such as acetone, ethylacetate, diethylmalonate, diethylether and isopropyl alcohol; hydrocarbons, such as methane, ethane and butane; chloro(fluoro)carbons, optionally containing hydrogen atoms, such as chloroform and trichlorofluoromethane; bis(alkyl)carbonates wherein the alkyl group has from 1 to 5 carbon atoms, such as bis(ethyl) carbonate and bis(isobutyl) carbonate.

When step (b) is completed, polymer ($P_{TPE}$) is generally isolated from the emulsion according to conventional methods, such as by coagulation by addition of electrolytes or by cooling.

According to a fourth variant, said polymer (P) is a thermoplastic polymer [polymer ($P_{PSU}$)], which comprises, based on the total weight of the polymer, at least 50 wt. % of recurring units comprising at least one group of the following formula:

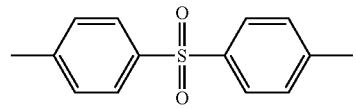

Preferably, said polymer ($P_{PSU}$) is chosen in the group comprising, preferably consisting of: polybiphenyldisulfone, polysulfone, polyphenylsulphone, polyethersulfone, copolymers and mixtures thereof.

Polysulfones are notable commercially available under the trade name UDEL® from Solvay Specialty Polymers U.S.A., LLC.

Preferably, said layer (S) has a thickness in the range from 0.1 mm to 55 mm, more preferably from 0.5 mm to 35 mm and even more preferably from 0.75 to 15 mm.

Preferably, said cable (C) further comprises at least one layer [layer ($C_1$)] interposed between said cable core and said layer (S), i.e. said layer (S) is not in direct contact with said cable core.

Typically, said cable (C) comprises a cable core, at least one layer (S) and at least one layer [layer ($C_1$)] interposed between said cable core and said layer (S), the cable core comprising a metallic inner conductor for transmitting electric signals and, depending on the use for which the cable is intended, further wires.

Depending on the final use for which said cable (C) is intended, said layer ($C_1$) can be for example a first insulating layer, more preferably a dielectric insulating layer.

Preferably, said cable (C) further comprises as the outermost layer, a jacket surrounding said layer (S). More preferably, said cable (C) comprises at least one layer interposed between said layer (S) and said jacket.

Preferably, said cable (C) further comprises a layer [layer $(C_2)$] interposed between said layer (S) and said jacket.

Preferably, said layer $(C_2)$ is a second insulating layer.

Said first and second insulating layers and the jacket can be manufactured by the skilled person following methods known in the art.

Typically, said insulating layer(s) is made from a composition comprising at least one polymer selected from the group comprising thermoplastic polyolefins as defined above, poly-vinyl chloride (PVC) and (per)fluoropolymers as defined above.

Typically, said at least one insulating layer is provided onto the cable core by a process comprising the steps of:

(I) providing a composition comprising at least one thermoplastic polymer selected in the group comprising polyolefins, poly-vinyl chloride (PVC) and (per)fluoropolymers;

(II) heating said composition at a temperature suitable for melting said at least one thermoplastic polymer;

(III) contacting the melted composition obtained in step (II) to a cable core comprising a metal conductor so as to provide said insulating layer.

Optionally, said steps (I) to (III) can be repeated in order to provide two or more insulating layers surrounding the cable core.

Preferably, before step (III), a step of heating the cable core to a temperature of from 50 to 150° C. is performed.

Preferably, said step (III) is performed by extruding said composition onto the cable core.

Extrusion conditions can be selected by the person skilled in the art. For example, the temperature is preferably from 150 to 300° C. Also, the extrusion rate is preferably from 300 m/min to 3000 m/min.

Cable (C) according to the present invention is advantageously selected from electric cables and data-transmission cables. More in particular, cable (C) according to the present invention is selected from coaxial cable, such as for signal transmission; earphone cable; shielded twisted pairs (STP), such as for data communication; USB cable; high voltage cables; permanent downhole cable (PDC); armoured cable, such as steel wire armoured cable; electric submergible pump power cable; heating cable.

Referring to FIG. 1, a cable 100 according to a first embodiment comprises: a cable core comprising at least one metallic conductor 101 and a shield layer 102, which is made from composition $(C_P)$ as defined above.

Figure 2:
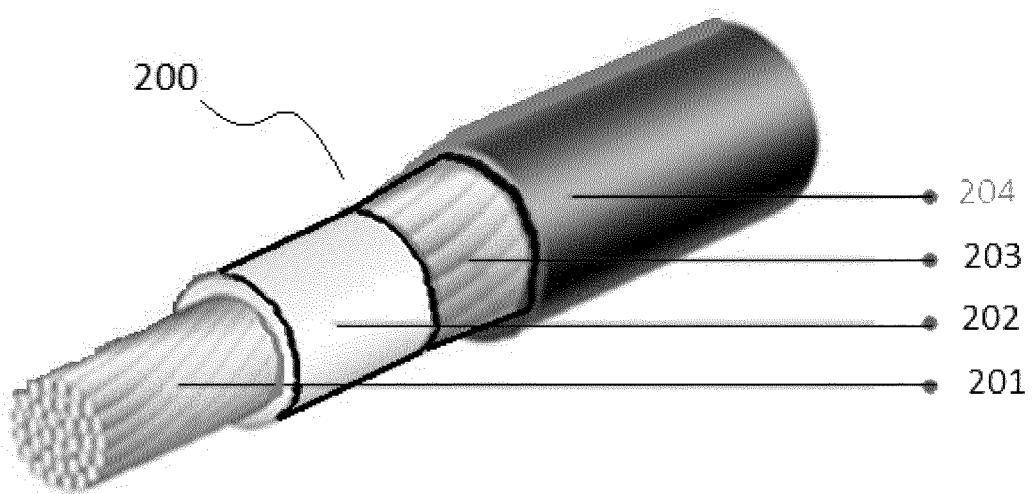
FIG. 2 is a cross-sectional view of an earphone cable.

Referring to FIG. 2, an earphone cable 200 comprises: a cable core comprising a metallic conductor 201; an insulating layer 202; a shield layer 203 made from composition $(C_P)$ as defined above; and a coating (or jacket) 204, as the outermost coating layer.

Figure 3:
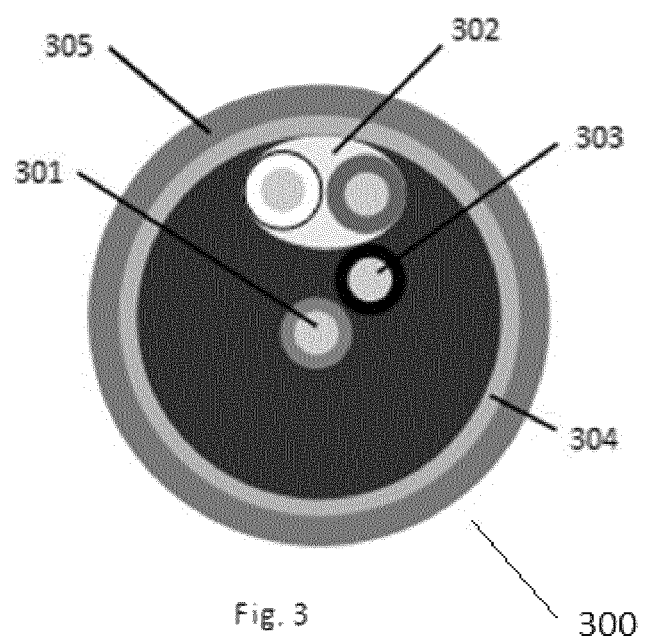
FIG. 3 is a cross-sectional view of a USB cable.

Referring to FIG. 3, a USB cable 300 comprises: a cable core comprising at least one power wire comprising a metallic inner conductor 301 and an insulating layer surrounding the inner conductor (not indicated in the figure), a pair of signal wires 302, a ground wire 303; a shield layer 304 made from composition $(C_P)$ as defined above; and a coating layer (or jacket) 305, as the outermost coating layer.

Typically, coaxial cables comprise (from the inside to the outside) a metallic wire, an insulation layer, a metallic braid and an outer jacket.

Advantageously, when cable (C) according to the present invention is a coaxial cable for signal transmission, layer (S) as defined above replaces the insulation layer and/or the metallic braid.

Typically shielded twisted pairs (STP) for data communication cables comprise (from the inside to the outside) several couples of twisted metallic wires, each of said metallic wire being surrounded by an insulation layer (twisted pairs), each couple being surrounded by a shielding layer, and an outer jacket. Said shielding layer is typically obtained by wrapping at least one metal foil or at least one conductive PET layer around each pair and/or around all the pairs in the cable.

Advantageously, when cable (C) according to the present invention is a shielded twisted pairs (STP) for data communication cable, layer (S) as defined above replaces the metal foils and/or the conductive PET layers.

Typically, high voltage cables comprise (from the inside to the outside) a metallic core, an insulation layer, a semiconductor layer, a metallic conductive shield and an outer jacket.

Advantageously, when cable (C) according to the present invention is a high voltage cable, layer (S) as defined above replaces the metallic conductive shield.

Typically, a permanent downhole cable (PDC) comprises (from the inside to the outside) a conductive cable core, an insulation layer, a filler layer, a tubing layer and an encapsulating layer.

Typically, a permanent downhole cable (PDC) can be a mono-conductor cable, a multi-conductor cable or a return serve or a shielded cable. Typically, the return serve cable comprises (from the inside to the outside) at least one central mono conductor, surrounded by an extruded insulating layer, a secondary jacket, and a copper serve (or braid) wounded over the secondary jacket and in direct contact with the outer metal tube. In the shielded cable a jacket is extruded over said copper serve (braid) to insulate it from the outer metal tube.

Advantageously, when cable (C) according to the present invention is a permanent downhole cable (PDC), layer (S) as defined above replaces the tubing layer and/or the braid or shielding layers.

Typically, a cable for powering electric submergible pumps (EPS) comprises (from the inside to the outside) a conductive cable core, an insulation layer, a barrier layer, a jacket, and an armour layer. The barrier layer typically comprises a fluoropolymer layer and a metallic braid and is aimed at protecting the cable against more aggressive well fluids.

Advantageously, when cable (C) according to the present invention is a cable for powering electric submergible pumps (EPS), layer (S) as defined above replaces the barrier layer.

Typically, a heating cable or heat trace cable comprises (from the inside to the outside) one or more cable cores (bus wires), one or more insulation layers, a metallic braid and a jacket. Typically, a self-regulating heating cable or heat trace cable comprises (from the inside to the outside) two metallic cores (bus wires), a self-regulating conductive core, an insulation layer, a metallic braid and a jacket.

Advantageously, when cable (C) according to the present invention is a (self-regulating) heating cable, layer (S) as defined above replaces the insulation layer and/or the metallic braid.

Under step (i) of the method of the present invention, said composition $(C_P)$ as defined above is prepared according to methods known in the art.

Preferably, step (ii) of the method of the present invention comprises a first step [step $(ii_a)$] of melting said composition $(C_P)$ as defined above and a second step [step $(ii_b)$] of extruding said composition $(C_P)$.

Advantageously, when polymer (P) is selected from polyolefin, polyamide and partially fluorinated polymer, step (iii) is performed with a nitrogen-containing gas.

Preferably, said nitrogen-containing gas is selected from $N_2$, $NH_3$ or mixtures thereof, optionally in admixture with nitrogen-free gas, such as $CO_2$ and/or $H_2$. More preferably, said nitrogen-containing gas is a mixture of $N_2$ and $H_2$.

The gas rate can be selected by the skilled person. For example, suitable gas rate is between 5 nl/min and 15 nl/min.

Advantageously, when polymer (P) is selected from perfluoropolymer, said step (iii) is performed in the presence of a gaseous compound [compound (G)] comprising at least one nitrogen atom bonded to at least one element belonging to Group 14 of the Periodic Table, even more preferably carbon or silicon.

Advantageously, said compound (G) is selected in the group comprising silazanes, aziridines, azides, anilines, pyrrole, pyridines, imines, nitriles, amines and amides. More preferably, said compound (G) is selected from the group comprising, even more preferably consisting of: allylamine, hexadimethylsilazane (HMDSN), pyrrolidine, pyrrole, acetonitrile, aniline.

Preferably, said step (iii) is performed by an atmospheric plasma process.

Preferably, said atmospheric plasma process is performed under atmospheric pressure and with an equivalent corona dose of from 50 $Wmin/m^2$ to 30,000 $Wmin/m^2$, more preferably of from 500 $Wmin/m^2$ to 15000 $Wmin/m^2$.

Advantageously, said surface ($S_e$) is continuously treated by said atmospheric plasma process in the presence of a nitrogen-containing gas.

The Applicant has surprisingly found that the so-treated surface ($S_e$) provides outstanding adhesion to the metal compound, applied thereto as disclosed below.

Preferably, under step (iv) of the present invention, said composition (C1) is in a solution or a colloidal suspension of the metallization catalyst in a suitable solvent, such as water.

Preferably, step (iv) is performed by dipping the surface ($S_e$) as obtained in step (ii) in said composition (C1).

Preferably, compounds that may be employed as metallization catalysts in the method of the present invention can be provided in the form of metal, ion or complex thereof.

When the metallization catalyst is in the form of a metal ion, the method according to the present invention comprises after step (iv) and before step (v), a step ($vi_b$) of reducing the metallization catalyst in the form of ion to metal.

Preferably, said metallization catalyst is selected in the group comprising Pd, Pt, Rh, Ir, Ni, Cu, Ag and Au catalysts.

More preferably, the metallization catalyst is selected from Pd catalysts, such as $PdCl_2$.

Preferably, under step (v), said composition (C2) is an electroless metallization plating bath, comprising at least one compound (M1), at least one reducing agent, at least one liquid medium and, optionally, one or more additives.

Preferably, said compound (M1) comprises one or more metal salts. More preferably, said compound (M1) preferably comprises one or more metal salts of the metals listed above with respect to compound (M).

Preferably, said reducing agent is selected from the group comprising formaldehyde, sodium hypophosphite, hydrazine, glycolic acid and glyoxylic acid.

Preferably, said liquid medium is selected from the group comprising water, organic solvents and ionic liquids.

Among organic solvents, alcohols are preferred such as ethanol.

Non-limiting examples of suitable ionic liquids include, notably, those comprising as cation a sulfonium ion or an imidazolium, pyridinium, pyrrolidinium or piperidinium ring, said ring being optionally substituted on the nitrogen atom, in particular by one or more alkyl groups with 1 to 8 carbon atoms, and on the carbon atoms, in particular by one or more alkyl groups with 1 to 30 carbon atoms.

Preferably, the ionic liquid is advantageously selected from those comprising as anion those chosen from halides anions, perfluorinated anions and borates.

Preferably, additives are selected from the group comprising salts, buffers and other materials suitable for enhancing stability of the catalyst in the liquid composition.

Preferably, said step (v) is performed at a temperature above 30° C., for example between 40° C. and 100° C.

Advantageously, according to an embodiment, step (v) is performed so as to provide a continuous layer comprising compound M onto said surface ($S_e$), i.e. a layer that completely covers said surface ($S_e$).

Embodiments wherein said layer comprising compound M covers only certain areas of said surface ($S_e$) are also encompasses by the present invention.

Preferably, said steps (iv) and (v) are performed as a single step [step (iii-D)], more preferably by electroless deposition.

By "electroless deposition" it is meant a redox process typically carried out in a plating bath between a metal cation and a proper chemical reducing agent suitable for reducing said metal cation in its elemental state.

The preferred conditions disclosed above with respect to step (iv) and step (v) apply whether step (iv) and step (v) are performed separately or when step (iv) and step (v) are performed as a single step (iii-D).

Optionally, the above method comprises after step (v), step (vi) of applying a composition [composition (C3)] containing at least one metal compound [compound (M2)] onto said surface ($S_{e\text{-}NM}$), so as to provide an external surface ($S_e$) comprising groups (N) and at least two compounds (M).

Preferably, said composition (C3) is an electrolytic solution, comprising at least one compound (M2), at least one metal halide and, optionally, at least one ionic liquid as defined above.

Said compound (M2) can be the same or different from said compound (M1).

Preferably, said compound (M2) is a metal salt deriving from Al, Ni, Cu, Ag, Au, Cr, Co, Sn, Ir, Pt and alloys thereof.

Preferably, said metal halide is $PdCl_2$.

Preferably, said step (vi) is performed by electro-deposition.

Within the present description and in the following claims, by "electro-deposition" it is meant a process using electrical current to reduce metal cations from an electrolytic solution.

Optionally, the above method comprises after step (v) or after step (vi), step (vii) of applying a composition [composition (C4)] containing at least one hydrogenated elastomer, so as to provide a layer [layer ($L_2$)] onto the external surface of said at least one layer L.

Preferably, said step (vii) is performed by extruding or curing said composition (C4). Step (vii) can be performed using conditions and processes known by the skilled person and selecting the parameters depending on the starting hydrogenated elastomer and on the thickness desired in the final product.

Should the disclosure of any patents, patent applications, and publications which are incorporated herein by reference conflict with the description of the present application to the extent that it may render a term unclear, the present description shall take precedence.

The invention will be herein after illustrated in greater detail by means of the Examples contained in the following Experimental Section; the Examples are merely illustrative and are by no means to be interpreted as limiting the scope of the invention.

Experimental Section

Materials:
HYFLON® P450 perfluoropolymer (herein after referred to as polymer P1) and HYFLON® P420 perfluoropolymer (herein after referred to as polymer P2) were obtained from Solvay Specialty Polymers Italy S.p.A.
Allylamine, hexadimethylsilazane (HMDSN), pyrrole and acetonitrile were obtained by Sigma-Aldrich.
Tecnoflon® P757 fluoroelastomer (herein after referred to as polymer P3) having Mooney viscosity measured at 120° C. according to ASTM D1646 of 21 MU, was supplied by Solvay Specialty Polymers Italy S.p.A.
Tecnoflon® FOR 539 fluoroelastomer (herein after referred to as polymer P4) having Mooney viscosity measured at 120° C. according to ASTM D1646 of 21 MU, was supplied by Solvay Specialty Polymers Italy S.p.A.
N990 MT carbon black was supplied by Cancarb
Luperox® 101XL45: 2,5-bis(tert-butylperoxy)-2,5-dimethylhexane, blend with calcium carbonate and silica, with 45 wt. % of solid content, was supplied by Total Petrochemicals USA, Inc.
DRIMIX® 75% TAIC: triallyl isocyanurate, with 75 wt. % of solid content, was supplied by Finco s.r.l.
Maglite® DE: magnesium oxide having a surface are of about 120 m²/g, was supplied by Merck
Rhenofit® CF: calcium hydroxide having a density of about 2.2 g/cm³ was supplied by Rhein Chemie
Preparation Method 1: Manufacture of a Multi-Layered Sample from Polymers P1 and P2

From each polymer P1 and P2, plaques measuring 10×10 cm and 150 μm thick were obtained.

Step a. The surface of each plaque was treated at atmospheric pressure by a radio-frequency plasma discharge process, using Plasmatreater® AS400 instrument, in the following conditions:
etching gas: $N_2$,
working frequency: 20 kHz
voltage: 0.3 kV.

During the treatment, each of the precursors listed in Table 1 below was deposited onto the surface of one plaque, after being vaporized and inputted into the plasma chamber.

Water contact angles of the samples thus obtained were measured. The measured values are reported in the following Table 1.

As comparison, a plaque obtained from the same polymers P1 and P2, was treated following the same procedure described in step (a), but without addition of the precursors. This comparison example was representative of the procedure known in the art for the treatment of partially fluorinated polymers.

As further comparison, plaques obtained from the same polymers P1 and P2, were treated following the same procedure described in step (a), but working in air, both with and without the precursor.

TABLE 1

| Plaque | Polymer used for making the Plaque | Treatment | Water contact angle |
|---|---|---|---|
| 1(*) | P1 | pristine surface | 102° |
| 2(*) | P1 | Step (a) without precursor | 101° |
| 3 | P1 | Step (a) + allylamine | 22.9° |
| 4 | P1 | Step (a) + HMDSN | 18.8° |
| 5 | P1 | Step (a) + pyrrole | 24.6° |
| 6 | P1 | Step (a) + acetonitrile | 41.8° |
| 7(*) | P1 | Step (a) under air without precursor | 98.3° |
| 8(*) | P1 | Step (a) under air + pyrrole | 94.3° |

(*)comparison

The above results demonstrated that the treatment according to the prior art with nitrogen gas only, or performed under air, were not effective on perfluoropolymers. On the contrary, all the samples treated under nitrogen and with a precursor provided a reduction of water contact angle and thus an increment of surface reactivity.

Step b. The surface of each Plaque, obtained after step (a) above, was coated with metallic nickel by electroless plating. First, the treated surface of the sample was activated by immersion in an aqueous solution containing 0.03 g/L of $PdCl_2$ for 3 minute (pH=9.5), resulting in the treated surface of the sample being entirely coated with Pd particles at a high density. The so activated surface was then immersed in an aqueous plating bath containing 10 g/L of $CuSO_4$, 27 g/L of ethylene-diamine-tetraacetic acid (EDTA), 7 g/L of formaldehyde and organic additives. The plating temperature was 45° C. and its pH value was 10. The thickness of the copper layer coated onto the treated surface was 0.5 μm as measured by SEM.

Metal Coating Selection

To maximize electrical properties and to select the more conductive metal, a comparison between bulk copper and nickel was done as follows:

| Metal | Electrical conductivity ($10^6$ Siemens/m) | Electrical resistivity ($10^{-8}$ Ohm · m) |
|---|---|---|
| Copper | 58.5 | 1.7 |
| Nickel | 14.3 | 7.0 |

The data demonstrated that copper was the best solution for electrical and shielding application.

Preparation Method 2: Manufacture of a Multi-Layered Sample from Polymers P3 and P4

The ingredients listed in the following Tables 2 and 3 were mixed together in an open mill mixer:

TABLE 2

Composition A

| Ingredients | Amount (phr) |
|---|---|
| Tecnoflon ® P757 | 100 |
| N990 MT carbon black | 30 |
| Luperox ® 101XL45 | 3 |
| DRIMIX ® 75% TAIC | 4 |

TABLE 3

| Composition B | |
|---|---|
| Ingredients | Amount (phr) |
| Tecnoflon ® FOR 539 | 100 |
| N990 MT carbon black | 30 |
| Maglite ® DE | 3 |
| Rhenofit ® CF | 6 |

Each composition A and B thus obtained was press-cured for 5 minutes at 170° C., so as to form two plaques (2 plaques from composition A and 2 plaques from composition B) of 2 mm thick and 130 mm of side.

The plaques obtained from composition A were then post-cured in an oven (in air) for 24 hours at 230° C., and the plaques obtained from composition B were post-cured in an oven (in air) for 24 hours at 250° C.

All the plaques obtained were then cleaned with a lab cloth soaked with isopropyl alcohol (IPA), in order to remove dirt and contaminants.

Step 2

The surface of plaques obtained in step 1 above was treated at atmospheric pressure by a radio-frequency plasma discharge process, using Plasmatreater® AS400 instrument, using the following conditions:

etching gas: $N_2$,
working frequency: 20 kHz
voltage: 0.3 kV.

Step 3

The surface of the plaques obtained after step 2 above was coated with metallic copper by electroless plating.

First, the treated surface of the plaques was activated by immersion in an aqueous solution containing 0.03 g/L of $PdCl_2$ for 3 minute (pH=9.5), resulting in the treated surface of the (P1) sample being entirely coated with Pd particles at a high density. Then, the surface was immersed in an aqueous plating bath containing 10 g/L of $CuSO_4$, 27 g/L of ethylene-diamine-tetraacetic acid (EDTA), 7 g/L of formaldehyde and organic additives. The plating temperature was 45° C. and its pH value was 10.

The thickness of the copper layer coated onto the treated surface was 0.5 μm as measured by SEM.

Double Metallic Layer Preparation Method

Plaques obtained as described in Preparation method 1 and Preparation method 2 were further treated according to the following procedure, in order to provide a further metallic layer.

Each plaques was immersed in an aqueous solution containing metal ions and a current flow was set up between the Plaques and the metallic counter electrode.

Depending on the required properties (such as increasing the chemical resistance or the conductivity), the aqueous solution had the following composition:

200 g/L $NiSO_4$, 100 g/L $NiCl_2$, 40 g/L $H_3BO_3$
220 g/L $CuSO_4$, 70 g/L $H_2SO_4$
40 g/L AgCl 500 g/L $Na_2S_2O_3$

Example 1—Methanol Permeation Test

Methanol permeation was measured according to an internal procedure developed on the base of the ASTM D814. The test apparatus consisted of a jar where methanol was placed and on which the test specimens were mounted while the jar was in an upright position. The so assembled jar was inverted in order to allow the liquid to enter in direct and constant contact with the rubber specimens. The assembly was held at the temperature of 40° C. The mass of liquid lost from the specimen's side was measured to evaluate the permeation rate (P parameter).

Two plaques from composition A (plaque A1 plaque A2) and two plaques from composition B (plaque B1 and plaque B2), prepared as described in Example 2 above, were subjected to the methanol permeation test following the procedure described above. The four Plaques were mounted with the polymeric layer facing methanol.

As comparison, a pristine plaque was prepared from composition A without the coating (plaque C1*) and subjected to the same test.

The results are provided in the following Table 4 and expressed as average results of Parameter P.

TABLE 4

| Plaque | Parameter P [g · mm/m² · d] – average value |
|---|---|
| A1, A2, B1, B2 | 20 |
| C1(*) | 390 |

(*) comparison

Example 2—Evaluation of Adhesion of the Metallic Layer

The adhesion of the metallic layer was evaluated on the metallic layer obtained on Plaques 3 to 6 obtained according to the invention and on the comparison Plaque 2(*), obtained as disclosed above.

The adhesion was evaluated as follows: using a cutting tool, two series of perpendicular cuts were performed on the metallic layer of each Plaque 3 to 6 and 2(*), in order to create a lattice pattern on them. A piece of tape was then applied and smoothened over the lattice and removed with an angle of 180° with respect to the metallic layer.

The adhesion of metallic layer was then assessed by comparing the lattice of cuts with the ASTM D3359 standard procedure. The classification of test results ranged from 5B to 0B, whose descriptions are depicted in Table 5 herein below.

TABLE 5

| ASTM D3359 Classification | Description |
|---|---|
| 5B | The edges of the cuts are completely smooth; none of the squares of the lattice is detached. |
| 4B | Detachment of flakes of the coating at the intersections of the cuts. A cross cut area not significantly greater than 5% is affected. |
| 3B | The coating has flaked along the edges and/or at the intersection of the cuts. A cross cut area significantly greater than 5%, but not significantly greater than 15% is affected. |
| 2B | The coating has flaked along the edges of the cuts partly or wholly in large ribbons, and/or it has flaked partly of wholly on different parts of the squares. A cross cut area significantly greater than 15%, but not significantly greater than 65%, is affected. |

TABLE 5-continued

| ASTM D3359 Classification | Description |
|---|---|
| 1B | The coating has flaked along the edges of the cuts in large ribbons and/or some squares have detached partly or wholly. A cross cut area significantly greater than 35%, but not significantly greater than 65%, is affected. |
| 0B | Any degree of flaking that cannot be classified even by classification 1B. |

The adhesion values obtained for the samples were as follows:
each of Plaque 3 to 6=5B;
Plaque 2(*)=0B
each of Plaque A1, A2, B1, B2=5B;

Another Plaque obtained as disclosed in "Preparation method 1" was subjected to thermal ageing by treatment at 250° C. for 100 hours. At the end of the thermal treatment, the surface of the sample comprising the metallic layer was cross-cut and the adhesion was evaluated as following the same classification from 0B to 5B.

The adhesion value obtained for the sample after thermal treatment was 5B.

The invention claimed is:

1. A cable (C) comprising at least one cable core and at least one shield layer (S) surrounding said cable core, characterized in that said at least one shield layer (S)
is made from a composition ($C_p$) comprising at least one melt-processable polymer (P) and
has an inner surface ($S_i$) and an outer surface ($S_o$) with respect to the position of the cable core, said surface ($S_o$) comprising at least one layer ($L_M$) comprising
at least one metal compound (M) selected from the group consisting of Ni, Cu, Pd, Co, Ag, Au, Pt and Sn; and
at least one nitrogen-containing group [group (N)] selected from the group consisting of allylamine, hexadimethylsilazane (HMDSN), pyrrolidine, pyrrole, acetonitrile, and aniline; said nitrogen-containing group (N) being chemically bonded to both said polymer (P) and said compound (M),
wherein said polymer (P) is a (per)fluorinated polymer selected from the group consisting of semi-crystalline perfluoro-polymer [polymer (Psc)], (per)fluoroelastomer [polymer ($P_{PFE}$)], and perfluorinated thermoplastic elastomer [polymer ($P_{TPE}$)].

2. The cable according to claim 1, wherein said polymer (P) is a semi-crystalline perfluoro-polymer [polymer (Psc)], said polymer (Psc) being a copolymer comprising recurring units derived from TFE and recurring units derived from at least one perfluorinated monomer different from TFE [comonomer (F)].

3. The cable according to claim 1, wherein said polymer (P) is a (per)fluoroelastomer ($P_{PFE}$) comprising recurring units derived from at least one (per)fluorinated monomer and, optionally, one or more cure sites, either as pendant groups bonded to certain recurring units or as ends groups of the polymer chain.

4. The cable according to claim 1, wherein said polymer (P) is a perfluorinated thermoplastic elastomer ($P_{TPE}$) comprising:
at least one elastomeric block (A) consisting of a sequence of recurring units derived from tetrafluoroethylene (TFE) and recurring units derived from at least one perfluorinated monomer other than TFE, and optionally of a minor amount of recurring units derived from at least one bis-olefin (OF) of formula

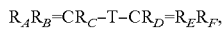

$R_A R_B = CR_C - T - CR_D = R_E R_F$, wherein $R_A$, $R_B$, $R_C$, $R_D$, $R_E$ and $R_F$, equal to or different from each other, are selected from the group consisting of H, F, Cl, $C_1$-$C_5$ alkyl groups and $C_1$-$C_5$ (per)fluoroalkyl groups, and T is a linear or branched $C_1$-$C_{18}$ alkylene or cycloalkylene group, optionally comprising one or more than one ethereal oxygen atom and optionally at least partially fluorinated, or a (per)fluoropolyoxyalkylene group,
wherein the molar percentage of recurring units derived from TFE in said block (A) is comprised between 40 and 82% moles, with respect to the total moles of recurring units of said block (A), and
wherein said block (A) possesses a glass transition temperature of less than 25° C., as determined according to ASTM D3418, and
at least one thermoplastic block (B) consisting of a sequence of recurring units derived from tetrafluoroethylene (TFE) and recurring units derived from at least one perfluorinated monomer other than TFE,
wherein the molar percentage of recurring units derived from TFE in said block (B) is comprised between 85 and 98% moles, and
wherein the crystallinity of said block (B) and its weight fraction in the polymer ($P_{TPE}$) are such to provide for a heat of fusion of the polymer ($P_{TPE}$) of at least 2.5 J/g, when determined according to ASTM D3418.

5. The cable according to claim 1, wherein said layer (S) has a thickness in the range from 0.1 mm to 55 mm.

6. The cable according to claim 1, wherein said cable (C) comprises at least one layer ($C_1$) interposed between said cable core and said layer (S) and/or at least one layer ($C_2$) interposed between said layer (S) and said jacket.

7. The cable according to claim 1, said cable (C) being selected from electric cables and data-transmission cables.

8. The cable according to claim 7, said cable (C) being selected from coaxial cables; earphone cables; shielded twisted pairs (STP); USB cables; high voltage cables; permanent downhole cables (PDC); armoured cables; electric submergible pump power cables; and heating cables.

9. A method for the manufacture of a cable (C) for electric or data transmission comprising at least one shield layer (S), said method comprising the following steps:
(i) providing a composition ($C_P$) comprising at least one melt-processable polymer (P), wherein said polymer (P) is a (per)fluorinated polymer selected from the group consisting of semi-crystalline perfluoro-polymer [polymer (Psc)], (per)fluoroelastomer [polymer ($P_{PFE}$)], and perfluorinated thermoplastic elastomer [polymer ($P_{TPE}$)];
(ii) processing said composition ($C_P$) to provide a layer (S) having an internal surface ($S_i$) and an external surface ($S_e$);
(iii) forming nitrogen-containing groups (N) onto said surface ($S_e$) said at least one nitrogen-containing groups (N) being selected from the group consisting of: allylamine, hexadimethylsilazane (HMDSN), pyrrolidine, pyrrole, acetonitrile, and aniline;
(iv) contacting said surface ($S_e$) as obtained in step (iii) with a first composition (C1) comprising at least one metallization catalyst; and
(v) contacting said surface ($S_e$) as obtained in step (iv) with a second composition (C2) containing at least one metal compound (M) so as to provide the cable (C)

comprising said at least one shield layer (S) having said internal surface ($S_i$) and said external surface ($S_e$), wherein said surface ($S_e$) comprises at least one metal compound (M) selected from the group consisting of Ni, Cu, Pd, Co, Ag, Au, Pt and Sn, and at least one nitrogen-containing group (N) chemically bonded to both said polymer (P) and said compound (M).

10. The method according to claim 9, said method comprising:
- (A) after said step (i) and before said step (ii), step ($i_b$) of providing at least one metal conductor, wherein said step (ii) is performed by processing said composition ($C_P$) to surround said at least one metal conductor; and
- (B) after said step ($i_b$) and before said step (ii), step ($i_c$) of forming at least one layer in contact and surrounding said at least one metal conductor.

11. The method according to claim 9, wherein said step (iii) is performed with a nitrogen-containing gas selected from $N_2$, $NH_3$ or mixtures thereof, optionally in admixture with nitrogen-free gas.

12. The method according to claim 11, wherein the nitrogen-free gas comprises $CO_2$, $H_2$ or a combination thereof.

13. The method according to claim 9, wherein said step (iii) is performed in the presence of a gaseous compound [compound (G)] comprising at least one nitrogen atom bonded to at least one element belonging to Group 14 of the Periodic Table.

14. The method according to claim 13, wherein the at least one element belonging to Group 14 of the Periodic Table is carbon or silicon.

* * * * *